(12) United States Patent
Larson, III et al.

(10) Patent No.: US 6,483,229 B2
(45) Date of Patent: Nov. 19, 2002

(54) METHOD OF PROVIDING DIFFERENTIAL FREQUENCY ADJUSTS IN A THIN FILM BULK ACOUSTIC RESONATOR (FBAR) FILTER AND APPARATUS EMBODYING THE METHOD

(75) Inventors: John D. Larson, III, Palo Alto, CA (US); Paul D. Bradley, Mountain View, CA (US); Richard C. Ruby, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/799,149

(22) Filed: Mar. 5, 2001

(65) Prior Publication Data

US 2002/0121840 A1 Sep. 5, 2002

(51) Int. Cl.[7] .................................................. H01L 41/04
(52) U.S. Cl. ....................... 310/348; 310/349; 310/363
(58) Field of Search ................................ 310/348, 349, 310/363, 320, 367

(56) References Cited

U.S. PATENT DOCUMENTS

| | | | | |
|---|---|---|---|---|
| 2,859,346 A | * | 11/1958 | Firestone et al. | 310/318 |
| 3,222,622 A | | 12/1965 | Curran et al. | 310/320 |
| 4,320,365 A | | 3/1982 | Black et al. | 333/187 |
| 5,185,589 A | * | 2/1993 | Krishnaswamy et al. | 310/320 |
| 5,587,620 A | | 12/1996 | Ruby et al. | 310/346 |
| 5,801,603 A | * | 9/1998 | Yamamoto et al. | 310/348 |
| 5,844,452 A | * | 12/1998 | Yamamoto et al. | 310/348 |
| 5,872,493 A | * | 2/1999 | Ella | 310/322 |
| 5,873,153 A | | 2/1999 | Ruby et al. | 29/25.35 |
| 5,894,647 A | | 4/1999 | Lakin | 29/25.35 |
| 6,060,818 A | | 5/2000 | Ruby et al. | 310/363 |
| 6,081,171 A | * | 6/2000 | Ella | 310/348 |
| 6,107,721 A | * | 8/2000 | Lakin | 310/321 |
| 6,307,447 B1 | * | 10/2001 | Barber et al. | 29/25.35 |
| 2001/0054941 A1 | * | 12/2001 | Shibata et al. | 333/189 |

OTHER PUBLICATIONS

Larson et al., A BAW Antenna Duplexer for the 1900 MHz PCS Band, Oct. 1999.
Figueredo et al., Thin film bulk Acoustic Wave Resonators (FBAR) and Filters for High Performance Wireless Systems, Feb. 1999.

* cited by examiner

Primary Examiner—Thomas M. Dougherty (57) ABSTRACT

A method for fabricating a resonator, and in particular, a thin film bulk acoustic resonator (FBAR), and a resonator embodying the method are disclosed. An FBAR is fabricated on a substrate by mass loading piezoelectric (PZ) layer between two electrodes. For a substrate having multiple resonators, only selected resonator is mass loaded to provide resonators having different resonance frequencies on the same substrate.

15 Claims, 5 Drawing Sheets

METHOD OF PROVIDING DIFFERENTIAL FREQUENCY ADJUSTS IN A THIN FILM BULK ACOUSTIC RESONATOR (FBAR) FILTER AND APPARATUS EMBODYING THE METHOD

BACKGROUND

The present invention relates to acoustic resonators, and more particularly, to resonators that may be used as filters for electronic circuits.

The need to reduce the cost and size of electronic equipment has led to a continuing need for ever smaller filter elements. Consumer electronics such as cellular telephones and miniature radios place severe limitations on both the size and cost of the components contained therein. Many such devices utilize filters that must be tuned to precise frequencies. Hence, there has been a continuing effort to provide inexpensive, compact filter units.

One class of filters that has the potential for meeting these needs is constructed from thin film bulk acoustic resonators (FBARs). These devices use bulk longitudinal acoustic waves in thin film piezoelectric (PZ) material. In one simple configuration, a layer of PZ material is sandwiched between two metal electrodes. The sandwich structure is preferably suspended in air by a support structure. When electric field is applied between the metal electrodes, the PZ material converts some of the electrical energy into mechanical energy in the form of mechanical waves. The mechanical waves propagate in the same direction as the electric field and reflect off of the electrode/air interface.

At a resonant frequency, the device appears to be an electronic resonator. When two or more resonators (with different resonant frequencies) are electrically connected together, this ensemble acts as a filter. The resonant frequency is the frequency for which the half wavelength of the mechanical waves propagating in the device is equal to the total thickness of the device for a given phase velocity of the mechanical wave in the material. Since the velocity of the mechanical wave is four orders of magnitude smaller than the velocity of light, the resulting resonator can be quite compact. Resonators for applications in the GHz range may be constructed with physical dimensions on the order of less than 100 microns in lateral extent and a few microns in thickness.

In designing and building miniature filters for microwave frequency usage, it is often necessary to provide resonators (for example, FBARs) having slightly different resonant frequencies, typically a few percent apart. Usually, two distinct frequencies suffice; however, more general filter designs may require three or more resonators each having distinct resonant frequencies. A continuing problem of these filters is to precisely offset the resonant frequencies of the resonators and at the same time allow the resonators to be fabricated on a single wafer, or substrate.

It is known that the frequency of the resonator depends inversely on the thickness of the resonator. To produce multiple resonators having offset frequencies, on a single substrate, one possible technique of mass loading the top metal electrode is disclosed in U.S. Pat. No. 5,894,647 issued to Lakin on Apr. 20, 1999. However, there remains a need for alternative techniques for providing individual resonators having different resonant frequencies on the same substrate.

SUMMARY

The need is met by the present invention. According to a first aspect of the present invention, a method for fabricating resonators is disclosed. First, a first bottom electrode and a second bottom electrode are fabricated on a substrate. Above the first and the second bottom electrodes, a core piezoelectric (PZ) layer having a first portion above the first bottom electrode and a second portion above the second bottom electrode is fabricated. Next, an additional PZ layer is fabricated above the first portion. Finally, a first top electrode above the additional PZ layer and a second top electrode above the second portion of the PZ layer are fabricated.

According to a second aspect of the present invention, an apparatus having a first resonator and a second resonator fabricated on a substrate is disclosed. The first resonator has a first bottom electrode; a first top electrode; a first piezoelectric (PZ) material sandwiched between the first bottom electrode and the first top electrode, the first PZ material including a core PZ layer and an additional PZ layer. The second resonator has a second bottom electrode; a second top electrode; a second PZ material sandwiched between the second bottom electrode and the second top electrode.

Other aspects and advantages of the present invention will become apparent from the following detailed description, taken in combination with the accompanying drawings, illustrating by way of example the principles of the invention.

DETAILED DESCRIPTION

As shown in the drawings for purposes of illustration, the present invention is embodied in techniques for fabricating resonators on a single substrate yet having different resonant frequencies.

Fabricating Thin Film Resonators by Mass Loading Piezoelectric Layer

In one embodiment, an apparatus having a first resonator and a second resonator on a substrate is disclosed. The first resonator, has two electrodes and a first piezoelectric (PZ) layer sandwiched between the two electrodes. The second resonator has two electrodes and a second PZ layer sandwiched between the two electrodes. The first PZ layer includes a core PZ layer and an additional PZ layer where as the second PZ layer includes only the core PZ layer. Hence, the first PZ layer is thicker than the second PZ layer, thus t he first resonator has a resonant frequency that is lower than that of the second resonator.

Figure 1:
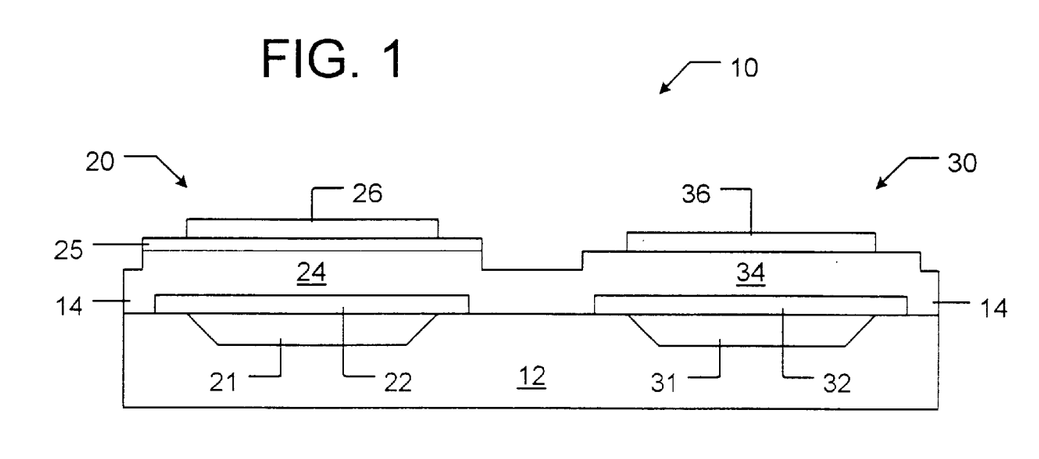
FIG. 1 is a simplified cross sectional side view of an apparatus including resonators in accordance with a first embodiment of the present invention.

Referring to FIG. 1, an apparatus 10 according to one embodiment of the present invention is illustrated. The apparatus 10 has a first resonator 20 and a second resonator 30 fabricated on a substrate 12. In one embodiment, the substrate 12 is a silicon substrate. The resonators 20 and 30 are acoustic resonators utilizing mechanical waves. For this reason, each of the illustrated resonators 20 and 30 are fabricated above a cavity 21 and 31, respectively. For example, U.S. Pat. No. 6,060,818 issued to Ruby et al. on May 9, 2000 illustrates this method and includes other details that are applicable here with the present invention.

In this subsection of the DETAIL DESCRIPTION section of the present document and in other subsections herein below, designators "first" and "second" are used to conveniently distinguish between different occurrences of similar devices or parts of devices, and are applicable in context of the particular subsection in which these designators are used. However, materials, processes, and general and relative dimensions and positions of various parts of devices discussed in any of the subsections may be applicable throughout the present document although discussed in one subsection.

The first resonator 20 is fabricated above and bridges a cavity 21 ("first cavity") and includes a bottom electrode 22 ("first bottom electrode"), a top electrode 26 ("first top electrode"), and PZ material sandwiched between the first bottom electrode 22 and the first top electrode 26. The PZ material includes a portion 24 ("first portion") of a PZ layer 14 ("core PZ layer") and an additional PZ layer 25 atop the first portion 24. The first portion 24 being a portion of the PZ layer 14 generally above the first bottom electrode 22. Reference numeral 24 indicates the general area of the first portion 24 of the PZ layer 14.

The PZ layer 14, the additional PZ layer, or both can be made using Aluminum Nitride (AlN) or any suitable piezoelectric material. The electrodes, for example, the first bottom electrode 22 can be Molybdenum. But again, any suitable conductor can be used to fabricate the electrodes.

The second resonator 30 is also fabricated above a cavity 31 ("second cavity") and includes a bottom electrode 32 ("second bottom electrode"), a top electrode 36 ("second top electrode") an PZ material sandwiched between the second bottom electrode 32 and the second top electrode 36. The PZ material includes a portion 34 ("second portion") of the core PZ layer 14. The second portion 34 being a portion of the core PZ layer 14 generally above the second bottom electrode 32. Reference numeral 34 indicates the general area of the second portion 34 of the core PZ layer 14.

Size of the first and the second resonators 20 and 30 depends upon the desired resonant frequency. For example, for a resonator having a resonant frequency of 1,900 MHz, dimensions of each of the resonators 20 and 30 can be about 150 by 200 microns covering approximately 30,000 square microns. At that frequency and size, the electrodes 22 and 26 are typically about 1,500 Angstroms thick each, and the core PZ layer 14 is about 21,000 Angstroms thick. To obtain a resonant frequency of about three percent less than 1,900 MHz, thickness of the PZ material is increased about 1,100 Angstroms. That is, thickness of the additional PZ layer may be about one to eight percent of the core PZ layer 14. This is illustrated by the first resonator 30. Of course, these measurements would be different for differing material and for different resonant frequency. In an attempt to clearly illustrate the present invention, various parts of the apparatus 10 of FIG. 1 are not shown in perfect scale relative to the other parts of the apparatus 10. The thickness of the additional PZ layer 25 may have a wide range compared to the thickness of the core PZ layer 14 including, without limitations, a range of two to six percent of the core PZ layer. In practice, the thickness of the additional PZ layer 25 is likely to be an order of magnitude less than the thickness of the core PZ layer 14.

In the illustrated example, the additional PZ layer 25 is fabricated only for the first resonator 20.

To fabricate the apparatus 10, the cavities 21 and 31 are etched and filled with some glass material which is later dissolved or otherwise removed to create the cavities. Next, the bottom electrodes 22 and 32 are fabricated. The bottom electrodes 22 and 32 may be fabricated using any of the well known technologies such as photolithography. Then, the core PZ layer 14 is deposited above the electrodes 22 and 32. To fabricate the resonators 20 and 30 having different thickness of the PZ material, multiple steps may be required to form the PZ layers. For example, a core PZ layer 14 is deposited on both the first and the second bottom electrodes 22 and 32. Then, a thin layer of a sacrificial material (mask) such as Silicon dioxide ($SiO_2$) is deposited over the core PZ layer 14. The sacrificial layer is not shown in FIG. 1 but it may be about 200 Angstroms thick. The sacrificial layer is patterned to expose the first portion 24 of the core PZ layer 14, the first portion 24 being the PZ material for the resonator whose resonant frequency is to be decreased. In the present example, that is the first resonator 20.

Next, additional PZ material (such as the AlN) is deposited on the entire substrate forming the additional PZ layer 25 of about 1,100 Angstroms in the present example. Next, the apparatus 10 is again patterned with photoresist to protect the areas where the additional PZ layer 25 is to remain, and the apparatus 10 is exposed to etching agent to remove the sacrificial layer. The etching agent can be a dilute hydrofluoric acid (HF), and depending upon the concentration of the HF, the exposure may be about a minute in duration. In so doing, the added PZ material is removed from above the second resonator 30 whose resonant frequency is to be unaltered. But, for the photoresist protected first resonator 20, the additional PZ layer 25 remains. For the example configuration, the additional PZ layer 25 of about 1,1000 Angstroms thick provides for about three percent lowering of the resonant frequency compared to the resonant frequency of the second resonator 30. In one embodiment, using the present technique, the resonant frequency is lowered between one and eight percent.

Finally, the top electrodes 28 and 38 are fabricated, and the cavities 21 and 31 are dissolved or otherwise removed to allow the resonators 20 and 30 to be suspended over the cavities 21 and 31, respectively.

Fabricating Thin Film Resonators by Mass Loading Top Electrode by Oxidation

Figure 2:
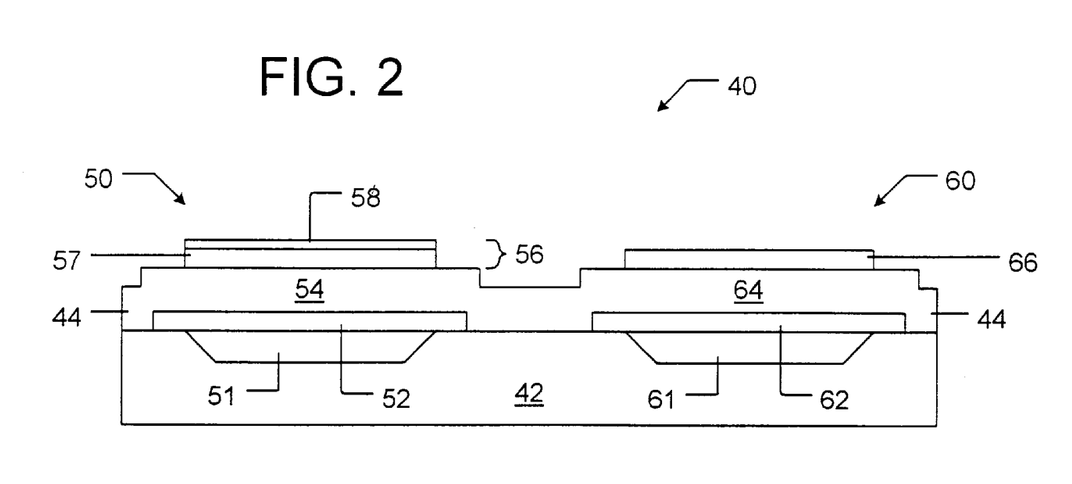
FIG. 2 is a simplified cross sectional side view of an apparatus including resonators in accordance with a second embodiment of the present invention.

Referring to FIG. 2, an apparatus 40 according to another embodiment of the present invention is illustrated. The apparatus 40 has a first resonator 50 and a second resonator 60 fabricated on a substrate 42. In one embodiment, the substrate 42 is a silicon substrate.

The resonators 50 and 60 are acoustic resonators utilizing mechanical waves. For this reason, each of the illustrated resonators 50 and 60 are fabricated above a cavity 51 and 61, respectively. The first resonator 50 of the apparatus 40 is fabricated above a first cavity 51 and includes a bottom electrode 52 ("first bottom electrode"), a PZ layer 54 ("first PZ layer"), and a top electrode 56 ("first top electrode"). The first PZ layer 54 may be a portion ("first portion") of a larger core PZ layer 44. The electrodes 52 and 56 are made from Molybdenum and the PZ layer 54 is made from Aluminum Nitride ("AlN"). However, any suitable material can be used for the electrodes and for the PZ layer.

The second resonator 60 of the apparatus 40 is fabricated above a second cavity 61 and includes a bottom electrode 62 ("second bottom electrode"), a PZ layer 64 ("second PZ layer"), and a top electrode 66 ("second top electrode"). The second PZ layer 64 may be a portion ("second portion") of the core PZ layer 44.

In one embodiment, the first top electrode 56 has two portions—a conductor portion 57 and an oxidized conductor portion 58. The conductor layer 57 comprises Molybdenum, and the oxidized conductor portion 58 is Molybdenum oxide. The first top electrode 56 may be fabricated using any conductor that progressively oxidizes when exposed to air and heat. Preferably, the first top electrode 56 has a property of unlimited oxidation. That is, it does not form a protective oxide coating on the surface which would limit the amount of oxidation the film could sustain. For discussion of oxidation properties, see, for example, *Encyclopedia of the Chemical Elements*, edited by C. A. Hampel, Reinhold Book Corporation, New York, 1968, p. 419. For oxidation characteristics of various conductors that may be used as the first top electrode 56, please see *The Oxide Handbook*, G. V. Samsonov, editor, IFI/Plenum Publishers, New York, 1973.

The first top electrode 56 starts out as an ordinary top electrode such as a second top electrode 66 of the second resonator 60, the second top electrode 66 including only a conductor layer. After fabricating the first top electrode 56, the apparatus 40 is exposed to heat and air to oxidize top surface of the first top electrode 56, resulting in the conductor oxide layer 58. The second top conductor 66 and other parts of the apparatus 40 are protected during the oxidation process using a mask. The mask is Silicon dioxide or other hard masking material. After sufficient oxidation of the first top layer 68, the mask is removed.

Assuming, for example, that the first resonator 50 has the dimensions described above, the first resonator 50 can be heated in air at around 300 degrees Celsius for about an hour to lower the resonant frequency of the first resonator 50 by about five MHz or more. By continuous application of heat, the resonant frequency of the first resonator 50 can be lowered from one to three percent compared to the resonant frequency of the first resonator 50 before the oxidation of the first top electrode 56 or compared to the second resonator 60.

To fabricate the first resonator 50, the first bottom electrode 52, the core PZ layer 44 including the first PZ layer 54, and the first top electrode 56 are fabricated using known methods. Then, the top electrode 56 is oxidized. The oxidization can be performed by heating the first resonator 50 in air. By continuous application of heat and continuous monitoring of the resonators, the degree to which the resonant frequency of the first resonator 50 is lowered can be controlled. For example, the resonant frequency of the second resonator 50 can be lowered in the range of about one to six percent.

Fabricating Thin Film Resonators by Mass Reduction of Top Electrode

Figure 3A:
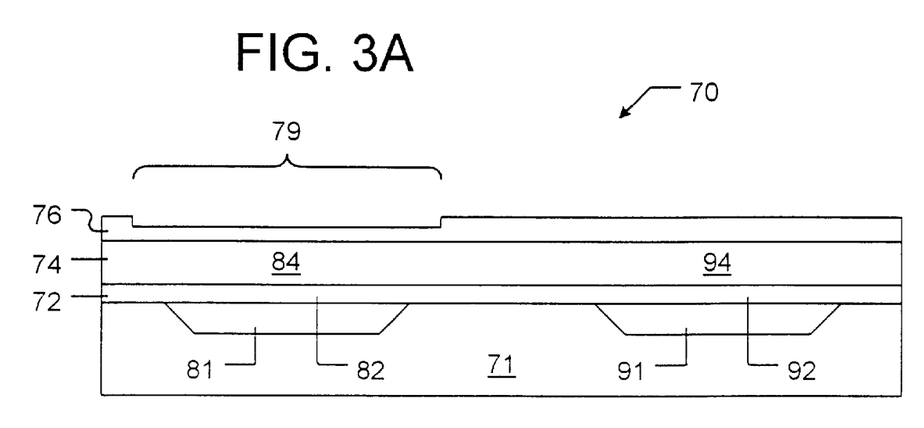
FIGS. 3A and 3B are simplified cross sectional side views of an apparatus including resonators in accordance with a third embodiment of the present invention.
Figure 3B:
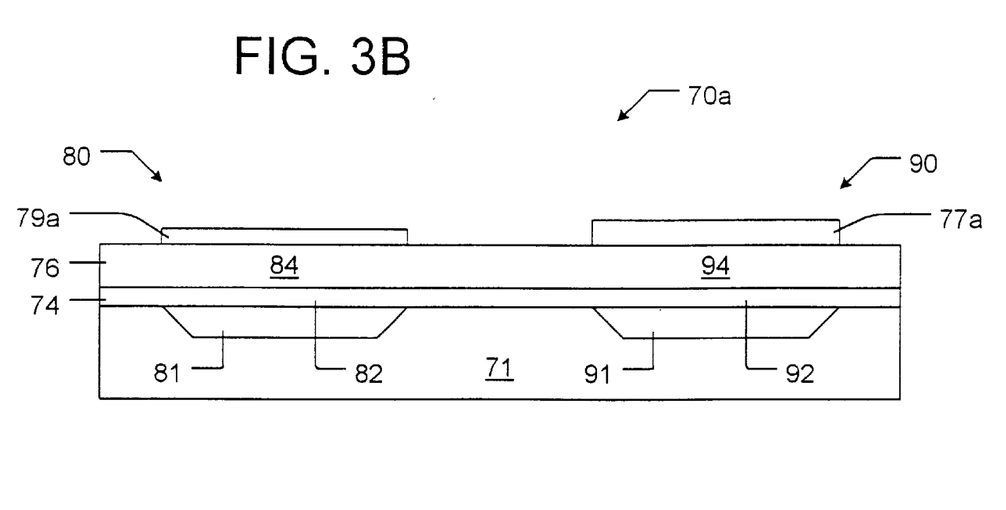

Referring to FIGS. 3A and 3B, apparatuses 70 and 70a are illustrated to discuss another embodiment of the present invention. The apparatus 70a of FIG. 3B represents the apparatus 70 of FIG. 3A after further processing. Accordingly, parts of the apparatus 70a of FIG. 3B are similar to those illustrated as apparatus 70 of FIG. 3A. For convenience, parts of the apparatus 70a that are similar to corresponding parts in the apparatus 70 are assigned the same reference numerals, analogous but changed parts are assigned the same numeral accompanied by letter "a", and different parts are assigned different reference numerals.

To fabricate resonators on a substrate according to the illustrated embodiment of the present invention, a bottom electrode layer 72 is fabricated on a substrate 71. Similar to the apparatus 10 of FIG. 1 or apparatus 40 of FIG. 2, the apparatus 70 may include a cavity 81 ("first cavity") over which a resonator 80 ("first resonator") is fabricated. Of course, the first cavity 81 may be etched and filled before the fabrication of the bottom electrode layer 72. A section ("first section" generally indicated by reference numeral 82) of the bottom electrode layer 72 over the first cavity 81 may function as bottom electrode 82 ("first bottom electrode") for a resonator ("first resonator") 80. Another section ("second section" generally indicated by reference numeral 92) of the bottom electrode layer 72 over a second cavity 91 may function as bottom electrode 92 ("second bottom electrode") for another resonator ("second resonator") 90. Here, the first bottom electrode 82 and the second bottom electrode 92 may be connected as illustrated. Alternatively, the bottom electrodes 82 and 92 may be separated similar to the bottom electrodes 22 and 32 of FIG. 1. For the purposes of discussing the present technique, this design choice is not critical.

Above the bottom electrode layer 72, a PZ layer 74 is fabricated over the bottom electrode layer 72. Again, the PZ layer 74, in one embodiment, is Aluminum Nitride (AlN), but can be any suitable piezoelectric material. Next, a top electrode layer 76 is fabricated over the PZ layer 74, the top electrode layer 76 having a predetermined thickness ("first thickness"). For example, for the 1900 MHz resonator example discussed above, the top electrode layer 76 may have a thickness of 1,000 Angstroms. Then, a selected area (generally indicated by bracket 79) of the top electrode layer 76 is partially etched. That is, some material (for example, Molybdenum) of the top electrode layer 76 is removed to result in the selected area 79 having a thinner layer of the top electrode 76. For brevity, the thickness of the selected area 79 will be referred to as the "second thickness" herein. FIG. 3A illustrates the apparatus 70 following the partial etch step of the present invention.

Finally, the top electrode layer 76, including the selected area 79, is patterned to form a first top electrode 79a and a second top electrode 77a. The first top electrode 79a and the first bottom electrode 77a sandwiches a portion 84 ("first portion") of the PZ layer 74 forming the first resonator 80. The second top electrode 77a and the second bottom electrode 92 sandwiches another portion 94 ("first portion") of the PZ layer 74 forming the first resonator 90. These operations result in an apparatus 70a having a first resonator 80 with a higher resonant frequency than that of the second resonator 90.

To partially etch the top electrode layer 76, the selected area 79 of the top electrode layer 76 is masked. Then, the apparatus 70 including the selected area 79 and the masked areas are exposed to etching agent. The etching agent can be a dilute hydrofluoric acid (HF), and depending upon the concentration of the HF, the exposure may be about a minute in duration.

Alternatively, the top electrode layer 76 may be etched using ion-milling, photoresist, sputter etch, or other techniques. For the purposes of this invention, the actual technique used for the etching of the top electrode layer 76 is not limited by the methods named herein. Finally, the mask is removed. Typical material used for masks is Silicon dioxide (SiO$_2$). The masking and etching processes are known in the art.

For a resonator, for example the first resonator 80, having a size of about 150 micron by 200 microns and having a resonant frequency of about 1,900 MHz, top electrode layer 76 may be about 1,500 Angstroms thick initially. The partial etching process may remove several hundred Angstroms, for example about two hundred Angstroms, to increase resonant frequency of the first resonator 80 by about three percent. In one embodiment, anywhere from one to thirty percent of the thickness of the top electrode layer 76 is removed at the selected area 79, increasing the resonant frequency of the first resonator 80 by about one to six percent depending upon the extent of the decrease in the thickness.

Fabricating Thin Film Resonators by Mass Loading Bottom Electrode

Figure 4:
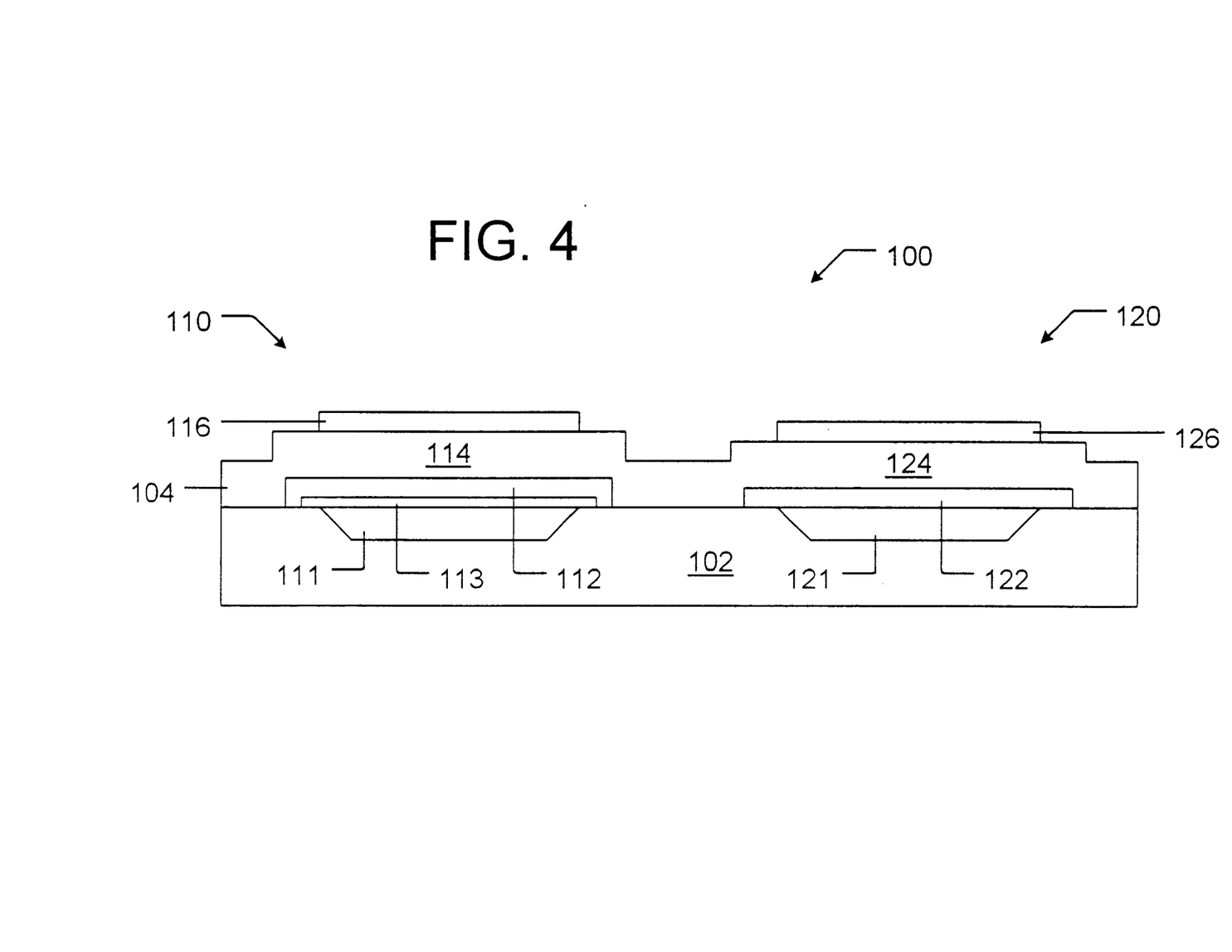
FIG. 4 is a simplified cross sectional side view of an apparatus including resonators in accordance with a fourth embodiment of the present invention.

Referring to FIG. 4, apparatus 100 illustrates another embodiment of the present invention. The apparatus 100 according to another embodiment of the present invention is illustrated. The apparatus 100 has a first resonator 110 and a second resonator 120 fabricated on a substrate 102. In one embodiment, the substrate 102 is a silicon substrate.

The resonators 110 and 120 are acoustic resonators utilizing mechanical waves. For this reason, each of the illustrated resonators 110 and 120 are fabricated above cavities 111 and 121, respectively. The first resonator 110 of the apparatus 100 is fabricated above a first cavity 111 and includes a bottom electrode ("first bottom electrode") which is a combination of a bottom loading electrode 113 and a first bottom core electrode 112; PZ material 114 ("first PZ material"); and a top electrode 116 ("first top electrode"). The first PZ material 114 is a portion ("first portion") of a PZ layer 104. In the illustrated embodiment, the electrodes 112, 113, and 116 are made from Molybdenum and the PZ layer 104 is made using Aluminum Nitride ("AlN"). However, any suitable conductor material can be used for the electrodes. Likewise, other suitable piezoelectric material can be used for the PZ layer 104. In one possible embodiment, the first bottom core electrode 112 and the bottom loading electrode 113 are made from the same material.

The second resonator 120 of the apparatus 100 is fabricated above a second cavity 121 and includes a bottom electrode 122 ("second bottom electrode" or "second bottom core electrode"), PZ material 124 ("second PZ material"), and a top electrode 126 ("second top electrode"). The second PZ material 124 may be a portion ("second portion") of the PZ layer 104.

Here, the second bottom electrode 122 and the first bottom core electrode 112 are similar in thickness and size. Accordingly, the first bottom electrode (referred herein after as "112+113" representing a combination of the first bottom core electrode 112 and the bottom loading electrode 113) is thicker than the second bottom electrode 122. For example, in one embodiment, the first bottom core electrode 112 and the second bottom electrode 122 may be approximately 1,500 Angstroms thick, and the bottom loading electrode 113 may add anywhere from 100 to 1,000 Angstroms to the first bottom core electrode 112. This results in the first resonator 110 having a lower resonant frequency than the second resonator 120. In one embodiment, the resonant frequency of the first resonator 110 is lower than that of the second resonator 120 by a range of one to six percent.

To fabricate the first resonator 110, the bottom loading electrode 113 is fabricated first. Then, the first bottom core electrode 112 is fabricated above the bottom loading electrode 113. Next, the PZ layer 104 is fabricated. Finally, the first top electrode 116 is fabricated above the PZ layer 104. As illustrated, the bottom loading electrode 113 may bridge the first cavity 111.

To fabricate the apparatus 100, the bottom loading electrode 113 is fabricated first. Then, the first bottom core electrode 112 and the second bottom core electrode 122 are fabricated, the first bottom core electrode 112 fabricated over the bottom loading electrode 113. Next, the PZ layer 104 is fabricated, the PZ layer having a first portion 114 over the first bottom core electrode 112 and a second portion 124 over the second bottom core electrode 122. Finally, the first top electrode 116 and the second top electrode 126 are fabricated over the first portion 114 and the second portion 124, respectively.

Fabricating Thin Film Resonators by Mass Loading Top Electrode and Over Etching

Figure 5A:
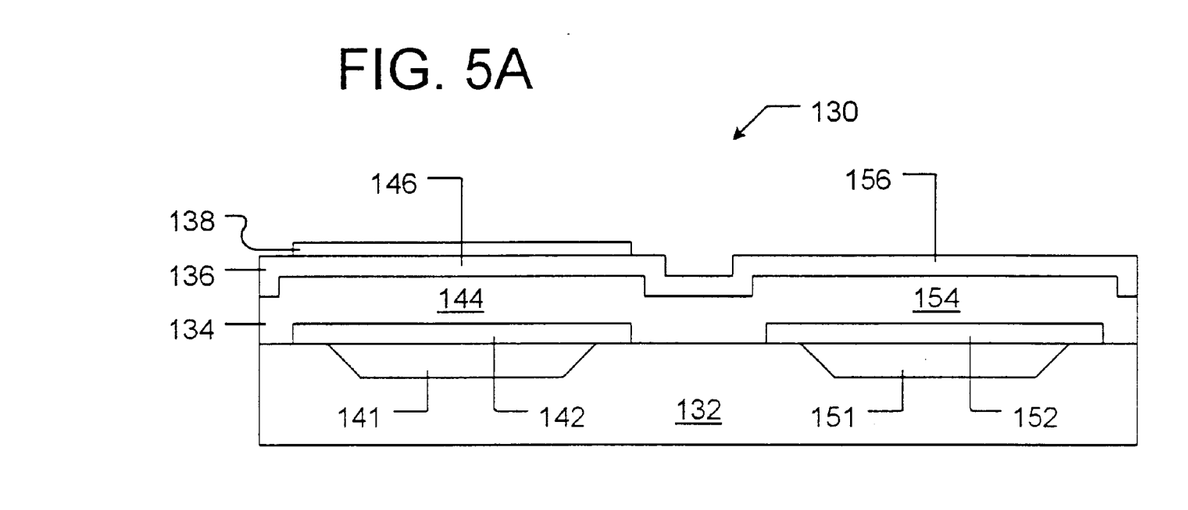
FIGS. 5A and 5B show simplified cross sectional side, views of an apparatus including resonators in accordance with a fifth embodiment of the present invention.
Figure 5B:
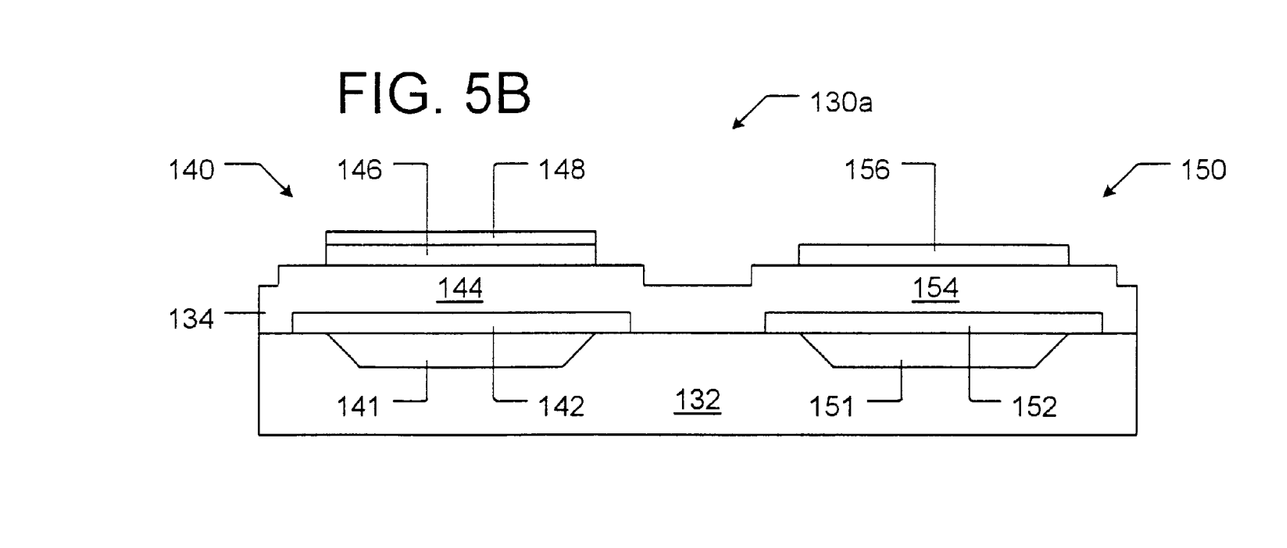

Referring to FIGS. 5A and 5B, apparatuses 130 and 130a are used to illustrate another embodiment of the present invention. The apparatus 130a of FIG. 5B represents the apparatus 130 of FIG. 5A after further processing. Accordingly, parts of the apparatus 130a of FIG. 5B are similar to those illustrated as apparatus 13 of FIG. 5A. For convenience, parts of the apparatus 130a that are similar to corresponding parts in the apparatus 130 are assigned the same reference numerals, analogous but changed parts are assigned the same numeral accompanied by letter "a", and different parts are assigned different reference numerals.

To fabricate resonators 140 and 150 on a substrate 132 according to the illustrated embodiment of the present invention, a first bottom electrode 142 and a second bottom electrode 152 are fabricated, the electrodes bridging first cavity 141 and second cavity 151 respectively.

Then, a piezoelectric (PZ) layer 134 is fabricated over both the first and the second bottom electrodes 142 and 152, the PZ layer 134 having a first portion 144 above the first bottom electrode 142 and a second portion 154 above the second bottom electrode 152. Next, a top electrode layer 136 is fabricated, the top electrode layer 136 having a first section 146 above the first portion 144 and a second section 156 over the second portion 154. Next, top loading layer 138 is fabricated above the first section 146 and preferably encompassing the entire first section 146. The top loading layer 138 may comprise conducting material, insulating material, or both, and include, without limitation, Molybdenum, Aluminum Nitride, or Silicon Dioxide. Then, the top loading layer 138 is over etched to form a first top electrode (combination of etched top loading layer 148 and the first section 146, or 148+146). That is, the top loading layer 138 and the top electrode layer 136 are etched at the same time to form the first top electrode 148+146. Of course, mask layer, such as a SiO$_2$ layer, can be used to pattern the electrode 148+146 and 156 from the etching agent.

A second top electrode 156 can be fabricated during the same step as the step to fabricate the first top electrode 148+146. Since no loading electrode exists over the second section 156 of the top electrode layer 136, the top electrode layer 136 is etched to remove all other parts of the top electrode layer 136 while leaving the second section 156 to become the second top electrode 156 and leaving the first top electrode 148+146.

To fabricate a single resonator, for example, the first resonator 140, the bottom electrode 142 is fabricated first.

Then, the PZ layer 134, the top electrode layer 136, and the top loading layer 138 are fabricated in turn. The top loading layer 138 preferably encompasses the first section 146 of the top loading layer 136, the first section 146 which will become a part of the top electrode 148+146. Finally, the top loading electrode layer 138 and the top electrode layer 136 are etched to form the top electrode 148+146 of the first resonator 140. These layers 138 and 136 may be etched in two steps. However, in one embodiment, they are etched in one step, or over etched. To over etch, the top loading layer 138 is masked first. Then, the top loading layer 138 and the top electrode layer 136 are etched at the same time to remove unmasked portions of these layers. For masking, Silicon dioxide ($SiO_2$) can be used.

For a resonator, for example the first resonator 140, having a size of about 150 micron by 200 microns and having a resonant frequency of about 1,900 MHz, the bottom electrode 142 and the top electrode layer 136 may be about 1,500 Angstroms thick each; the PZ layer 134 may be about 21,000 Angstroms thick; and the top loading layer 138 may be in a range of 100 to 1,000 Angstroms thick, or about one to six percent of thickness of the top electrode layer 134. In one embodiment, using this technique, resonant frequency of the first resonator may be decreased by one to six percent.

Fabricating Thin Film Resonators by Mass Reduction of the Piezoelectric Layer

Figure 6A:
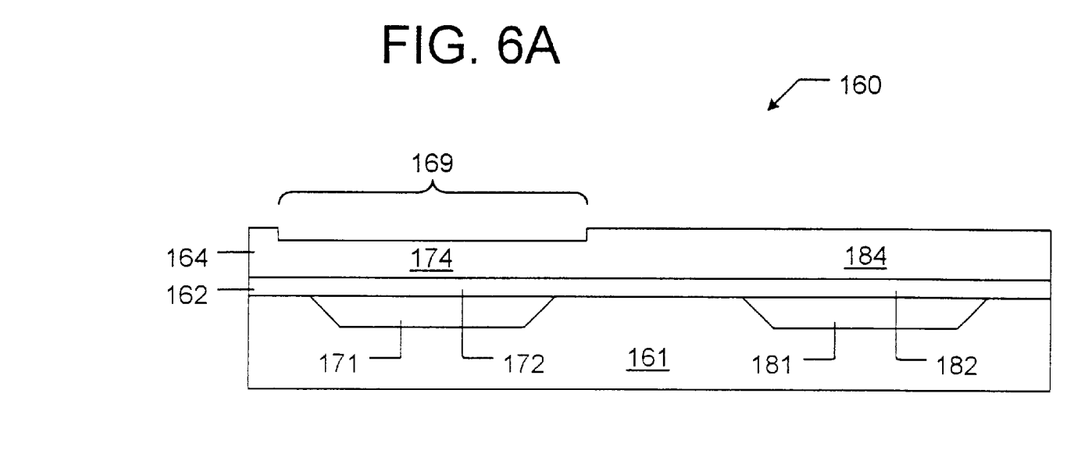
FIGS. 6A and 6B are simplified cross sectional side views of an apparatus including resonators in accordance with a sixth embodiment of the present invention.
Figure 6B:
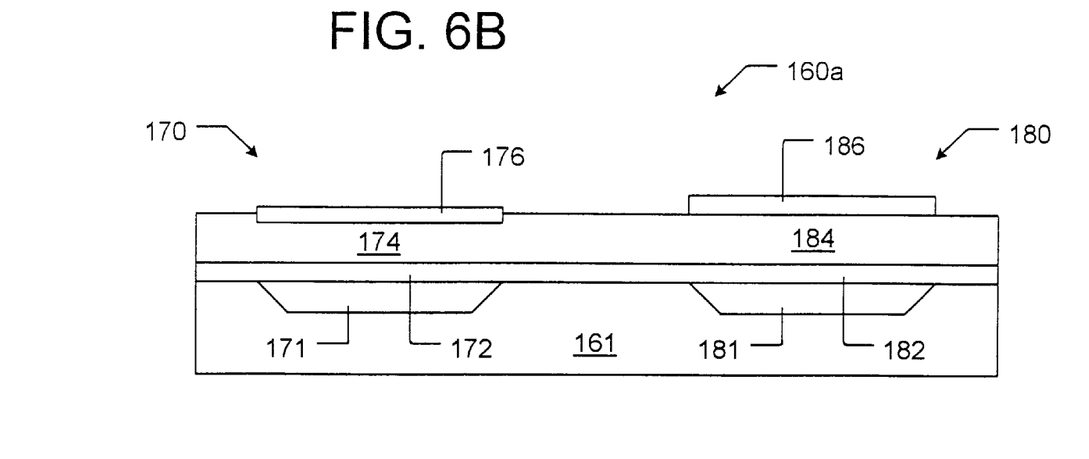

Referring to FIGS. 6A and 6B, apparatuses 160 and 160*a* are illustrated to discuss another embodiment of the present invention. The apparatus 160*a* of FIG. 6B represents the apparatus 160 of FIG. 6A after further processing. Accordingly, parts of the apparatus 160*a* of FIG. 6B are similar to those illustrated as apparatus 160 of FIG. 6A. For convenience, parts of the apparatus 160*a* that are similar to corresponding parts in the apparatus 160 are assigned the same reference numerals, analogous but changed parts are assigned the same numeral accompanied by letter "a", and different parts are assigned different reference numerals.

To fabricate resonators on a substrate according to the illustrated embodiment of the present invention, a bottom electrode layer 162 is fabricated on a substrate 161. Similar to the apparatus 10 of FIG. 1 or apparatus 40 of FIG. 2, the apparatus 160 may include a cavity 171 ("first cavity") over which a resonator 170 ("first resonator") is fabricated. Of course, the first cavity 171 may be etched and filled before the fabrication of the bottom electrode layer 162.

A section ("first section" generally indicated by reference numeral 172) of the bottom electrode layer 162 over the first cavity 171 may function as bottom electrode 172 ("first bottom electrode") for a resonator ("first resonator") 170. Another section ("second section" generally indicated by reference numeral 181) of the bottom electrode layer 162 over a second cavity 181 may function as bottom electrode 182 ("second bottom electrode") for another resonator ("second resonator") 180. Here, the first bottom electrode 172 and the second bottom electrode 182 may be connected as illustrated. Alternatively, the bottom electrodes 172 and 182 may be separated similar to the bottom electrodes 22 and 32 of FIG. 1. For the purposes of discussing the present technique, this design choice is not critical.

Above the bottom electrode layer 162, a PZ layer 164 is fabricated over the bottom electrode layer 162. Again, the PZ layer 164, in one embodiment, is Aluminum Nitride (AlN), but can be any suitable piezoelectric material. Next, a selected portion (generally indicated by bracket 169) of the core PZ layer 164 is partially etched. The etching step may remove anywhere from one to thirty percent, in thickness, of the PZ layer increasing resonant frequency of the resulting resonator 170 by one to six percent due to the reduction of thickness of the PZ layer. FIG. 6A illustrates the apparatus 160 following the partial etch step of the present invention.

Finally, the top electrode layer 176 is fabricated over the partially etched portion 174 of the PZ layer 164, forming a first resonator 170.

To partially etch the PZ layer 164, the selected portion 169 of the PZ layer 164 is masked. Then, the apparatus 160 including the selected area 169 and the masked areas are exposed to etching agent. The etching agent can be a dilute hydrofluoric acid (HF), and depending upon the concentration of the HF, the exposure may be about a minute in duration. Alternatively, the PZ layer 164 may be etched using ion-milling, photoresist, sputter etch, or other techniques. For the purposes of this invention, the actual technique used for the etching of the PZ layer 164 is not limited by the methods named herein. Finally, the mask is removed. Typical material used for masks is Silicon dioxide ($SiO_2$). The masking and etching processes are known in the art.

For a resonator, for example the first resonator 170, having a size of about 150 micron by 200 microns and having a resonant frequency of about 1,900 MHz, the PZ layer 164 may be about 21,000 Angstroms thick. The selected, partially etched potion may be thinner by one to thirty percent, thus increasing the resonant frequency of the first resonator 170 by one to thirty percent.

The apparatus 160 and 160*a* may also include a second resonator 180 fabricated over a second cavity 181 and having a bottom electrode 182, PZ layer 184 (a "second portion"), and a top electrode 186. For the purposes of illustration, the second portion 184 of the PZ layer 164 is not partially etched.

CONCLUSION

From the foregoing, it will be appreciated that the present invention is novel and offers advantages over the current art. The present invention discloses techniques to fabricate FBARs having different resonant frequencies on a single substrate. Although a specific embodiment of the invention is described and illustrated above, the invention is not to be limited to the specific forms or arrangements of parts so described and illustrated. For example, differing configurations, sizes, or materials may be used to practice the present invention. The invention is limited by the claims that follow.

What is claimed is:

1. An apparatus comprising:

a substrate;

a first resonator fabricated on the substrate, the first resonator comprising
a first bottom electrode;
a first top electrode;
a first piezoelectric (PZ) portion sandwiched between the first bottom electrode and the first top electrode, the first PZ portion being a portion of a core PZ layer;
an additional PZ layer also sandwiched between the first bottom electrode and the first top electrode;

a second resonator fabricated on the substrate, the second resonator comprising
a second bottom electrode;
a second top electrode; and
a second PZ portion sandwiched between the second bottom electrode and the second top electrode such that the first resonator is fabricated having higher mass than the second resonator.

2. The apparatus recited in claim 1 wherein the first PZ portion comprises Aluminum Nitride (AlN).

3. The apparatus recited in claim 1 wherein the first bottom electrode comprises Molybdenum.

4. The apparatus recited in claim 1 wherein the first resonator bridges a first cavity.

5. The apparatus recited in claim 1 wherein the first resonator has a resonant frequency approximately three percent lower compared to that of the second resonator.

6. The apparatus recited in claim 1 wherein the core PZ layer and the additional PZ layer comprises the same material.

7. The apparatus recited in claim 1 wherein thickness of the additional PZ layer is an order of magnitude smaller than that of the core PZ layer.

8. The apparatus recited in claim 1 wherein thickness of the additional PZ layer is in a range from one to eight percent of thickness of the core PZ layer.

9. The apparatus recited in claim 1 wherein resonant frequency of the first resonator is one to eight percent lower than resonant frequency of the second resonator.

10. An apparatus comprising:
a substrate;
a first resonator fabricated on the substrate, the first resonator comprising
a first bottom electrode;
a first top electrode;
a first piezoelectric (PZ) portion;
a second resonator fabricated on the substrate, the second resonator comprising
a second bottom electrode;
a second top electrode; and
a second PZ portion, the second PZ portion having a thickness less than thickness of the first PZ portion.

11. The apparatus recited in claim 10 wherein the first PZ portion comprises Aluminum Nitride (AlN).

12. The apparatus recited in claim 10 wherein the first bottom electrode comprises Molybdenum.

13. The apparatus recited in claim 10 wherein the first resonator bridges a first cavity.

14. The apparatus recited in claim 10 wherein the first resonator has a resonant frequency approximately three percent lower compared to that of the second resonator.

15. The apparatus recited in claim 10 wherein resonant frequency of the first resonator is one to eight percent lower than resonant frequency of the second resonator.

* * * * *